(12) United States Patent
Behrens et al.

(10) Patent No.: US 6,871,847 B2
(45) Date of Patent: Mar. 29, 2005

(54) METHOD OF, AND APPARATUS FOR, HANDLING AN EXPOSURE SURFACE TO BE EXPOSED, IN PARTICULAR, A PRINTING PLATE

(75) Inventors: Gunnar Behrens, Kiel (DE); Bernd Lassen, Mönkeberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 179 days.

(21) Appl. No.: 10/062,060

(22) Filed: Feb. 1, 2002

(65) Prior Publication Data

US 2002/0100386 A1 Aug. 1, 2002

(30) Foreign Application Priority Data

Feb. 1, 2001 (DE) .......................... 101 04 415

(51) Int. Cl.[7] .................................. B65H 5/22
(52) U.S. Cl. .................... 271/3.14; 271/303; 271/85
(58) Field of Search ................... 271/3.14, 303, 271/85, 268; 101/408, 477; 347/164, 262, 264; 346/134, 136; 198/468.2, 346.2

(56) References Cited

U.S. PATENT DOCUMENTS

| | | | |
|---|---|---|---|
| 3,891,204 A | * | 6/1975 | Mager .......................... 271/85 |
| 5,619,246 A | | 4/1997 | Straayer et al. |
| 5,809,360 A | | 9/1998 | Blake et al. |
| 5,818,508 A | * | 10/1998 | Straayer et al. ............. 347/262 |
| 6,257,819 B1 | * | 7/2001 | Garioni ....................... 414/155 |

FOREIGN PATENT DOCUMENTS

| | | |
|---|---|---|
| DE | 34 40 909 A1 | 5/1986 |
| DE | 40 36 129 C2 | 5/1991 |
| JP | 07 005 694 A | 1/1995 |

\* cited by examiner

*Primary Examiner*—David H. Bollinger
(74) *Attorney, Agent, or Firm*—Laurence A. Greenberg; Werner H. Stemer; Gregory L. Mayback

(57) ABSTRACT

A method of and an apparatus for handling an exposure surface to be exposed includes the steps of hanging the exposure surface in a transitional state during introduction into the exposure region of an exposure unit and/or during discharge from an exposure unit. The exposure surface is transferred from an approximately horizontal orientation in a feed region or loading region into a hanging orientation and/or is lowered for introduction into the exposure unit. The exposure surface to be exposed is, in particular, a printing plate. The exposure unit is, preferably, a printing plate exposer, and is, in particular, an inner-drum printing plate exposer.

30 Claims, 1 Drawing Sheet

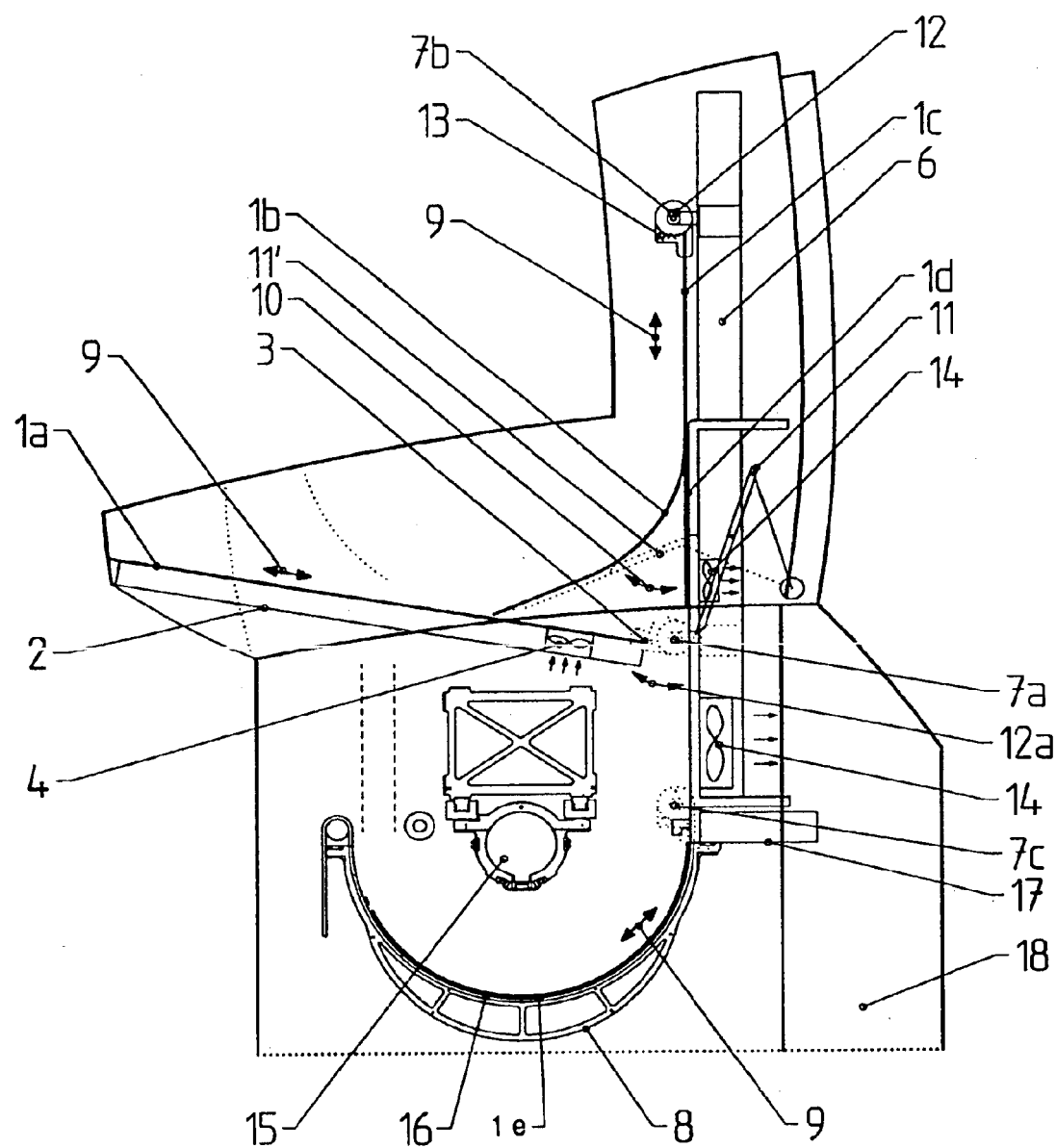

METHOD OF, AND APPARATUS FOR, HANDLING AN EXPOSURE SURFACE TO BE EXPOSED, IN PARTICULAR, A PRINTING PLATE

BACKGROUND OF THE INVENTION

FIELD OF THE INVENTION

The invention relates to a method of handling an exposure surface that is to be exposed, in particular, a printing plate, during introduction into the exposure region of an exposure unit and/or during discharge from an exposure unit, preferably, a printing plate exposer, and, in particular, an inner-drum printing plate exposer.

The invention also relates to an apparatus for handling an exposure surface to be exposed, in particular, a printing plate, during introduction into the exposure region of an exposure unit and/or during discharge from an exposure unit, preferably, a printing plate exposer, and, in particular, an inner-drum printing plate exposer, preferably, for implementing the abovementioned method.

The exposure surface to be exposed may be, in particular, a film for exposing a printing plate or a printing plate itself that is to be exposed directly. Here, it is immaterial as to whether the printing plate is a metallic printing plate or a printing plate made of plastic, for example, of polyester. The manner of exposure, in principle, is not important either. Thus, the procedure used may be, for example, exposure using visible light, exposure using ultraviolet light, or thermal exposure with high-energy light by ablation.

For the exposure, the exposure surface that is to be exposed has to be introduced into the exposure region of the exposure unit of an exposure apparatus, that is to say, for example, of a film or plate exposer, and discharged from the exposure unit again after the exposure operation. It is possible to distinguish between, in particular, three types of exposers in terms of the geometry thereof in the exposure unit, namely, an inner-drum exposer with a trough-like exposure region into which the exposure surface has to be introduced, an outer-drum exposer, the exposure surface being mounted on the outside of the drum thereof, and a flat-bed exposer, into which the exposure surface is introduced in a non-curved, flat state.

With all three types of exposers, the exposure surface that is to be exposed is usually introduced from a feed region and, following exposure, discharged into a discharge region. The discharge region is used for guidance and transportation purposes, for transporting and deflecting rollers, (conveying) belts, rollers, directing plates or similar elements and members. In the case of such handling, however, the exposure surfaces themselves are subjected to very high mechanical loading. In particular, it is possible damage to result on the front side, which is to be exposed, in the area of the exposure surface that is to be exposed. As a result, the product desired from the exposure may be impaired as far as precluding usability.

SUMMARY OF THE INVENTION

It is accordingly an object of the invention to provide a method of, and apparatus for, handling an exposure surface that is to be exposed, in particular a printing plate, that overcomes the hereinafore-mentioned disadvantages of the heretofore-known devices and methods of this general type and that handles the exposure surface more carefully, and preferably, realizes a more reliably reproducible, automatable, and, in the end, more precise handling procedure.

With the foregoing and other objects in view, there is provided, in accordance with the invention, a method of handling an exposure surface, including at least one of the steps of hanging the exposure surface in a transitional state during introduction of the exposure surface into an exposure region of an exposure unit, and hanging the exposure surface in a transitional state during discharge from the exposure unit.

The invention achieves its objectives by hanging the exposure surface in a transitional state. Preferably, the exposure surface is a printing plate. Also, preferably, the exposure unit is a printing plate exposer, in particular, an inner-drum printing plate exposer.

A hanging exposure surface only has to be retained in a top border region, which may be located outside that area of the front side of the exposure surface that is to be exposed, while it is possible to avoid contact in other regions of the contact surface. In particular, it is, thus, possible, according to the invention, for the exposure surface, located on its rear side, for example, advantageously to be taken into a hanging position and deposited in the region of the exposure unit, for example, lowered into a trough of an inner drum, where, in turn, the rear side of the exposure surface comes into direct contact with the exposure unit, without any other guide elements or transporting members there between having to come into contact with the exposure surface. In particular, the area that is to be exposed advantageously remains fully protected.

Thus, in accordance with another mode of the invention, the exposure surface that is to be exposed may preferably be transferred from an approximately horizontal orientation in a feed region or loading region, for example, from a type of table top or from a magazine, into a hanging orientation and lowered for introduction into the exposure unit. After the exposure, it is possible for the exposure surface, in particular, to be discharged on the same or some other route back or into another discharge region.

For raising into the hanging position, in accordance with a further mode of the invention, the exposure surface, as has already briefly been mentioned, is preferably gripped merely in a border region and drawn upward. Such steps can take place with friction-reducing action, and also carefully in respect of the rear side of the exposure surface, on an air cushion, which may be produced by fed air.

When the exposure surface has then reached its hanging position, before being lowered into the exposure unit, it is possible, conversely, for air to be extracted by suction beneath or behind the rear side of the exposure surface to achieve a certain level of attachment of the exposure surface to a guide. As a result, the exposure surface can still be moved easily but is guided by an abutment and can be moved more precisely, in particular, without it buckling, shearing out, or tilting. In the exposure position, the exposure surface, during the exposure, is fixed in a non-slip manner in the exposure unit preferably by (relatively pronounced) suction attachment.

It is additionally possible for the exposure surface to be aligned in a feed or discharge region and/or in the exposure region, for example, by straightforward directing surfaces.

In accordance with an added mode of the invention, the exposure surface is hanged in the transitional state before and after an exposure of the exposure surface.

In accordance with an additional mode of the invention, after an exposure of the exposure surface, the exposure surface is transferred into the hanging orientation and then the exposure surface is moved into an approximately horizontal discharge position.

In accordance with yet another mode of the invention, the exposure surface is discharged from the exposure unit to a discharge region and the feed region and the discharge region are the same region.

In accordance with yet a further mode of the invention, on a course from the feed region, through the hanging orientation, into the exposure region and back, the exposure surface is selectively directed with a route diverter from the hanging orientation into the feed region, the discharge region, or the exposure region.

In accordance with yet an added mode of the invention, placement of the exposure surface is enhanced in the hanging orientation with suction air.

In accordance with yet an additional mode of the invention, the exposure surface is discharged from the exposure unit to a discharge region and the exposure surface is aligned in the feed region, the discharge region, and/or the exposure region.

In accordance with again another mode of the invention, the exposure surface is punched in the fixed state after the exposure operation.

In accordance with again a further mode of the invention, the exposure surface is fed to a punch and the exposure surface is guided past the punch in a removal direction from the exposure unit.

In accordance with again an added mode of the invention, the exposure surface is hung in a transitional state during introduction of the exposure surface into an exposure region of an exposure unit and is hung in a transitional state during discharge from the exposure unit.

With the objects of the invention in view, in an apparatus for handling and exposing an exposure surface, the apparatus having an exposure unit with an exposure region, there is also provided a handler including an exposure surface hanging device for hanging the exposure surface at least one of in a transitional state during introduction of the exposure surface into the exposure region and in a transitional state during discharge from the exposure unit.

An apparatus according to the invention of the generic type mentioned in the introduction is distinguished, in an independent solution of the set object, by a hanging device for the exposure surface. Such a configuration makes possible a hanging (transition) position of the exposure surface, the advantages of which have already been described in conjunction with the method according to the invention. For such a purpose, the apparatus according to the invention preferably includes a lifting/lowering device for the exposure surface that is to be exposed.

In accordance with again an additional feature of the invention, the hanging device has at least one gripper for enclosing or gripping the border of the exposure surface. Thus, the exposure surface can be gripped and raised as carefully as possible, in particular, in respect of the exposure-active region.

In accordance with still another feature of the invention, to guide the lifting/lowering device and the actual exposure surface that is to be exposed, the hanging device preferably has an approximately vertically extending boom that, in particular, is also space-saving.

In accordance with still a further feature of the invention, with the hanging device, it is even possible to make direct use of a feed region for exposure surfaces that are to be exposed. The feed region may include, for example, an approximately horizontally aligned table top, preferably oriented approximately ten degrees from horizontal, but may also include, for example, a magazine, which can preferably be exchanged and attached and by which a relatively large number of exposure surfaces can be introduced into the feed region. Magazine handling is advisable, in particular, when working with exposure surfaces that are sensitive to daylight because they can, thus, be introduced into the exposer in a light-protected manner and possibly also discharged again in the same way. In particular, the invention allows the operation of reloading the exposer to be automated overall and makes utilization of the exposer more economical.

In accordance with still an added feature of the invention, it is advantageous for the operating procedure if the inlet or introduction region to the exposure unit is disposed beneath the hanging device. As a result, the exposure surface can be lowered in the hanging state and displaced into the exposure position in a directed manner.

In accordance with still an additional feature of the invention, the hanging device has an exposure surface hanging region and a feed region connected to the hanging region in an exposure surface movement direction.

In accordance with another feature of the invention, a route diverter that is preferably provided ensures that the exposure surface optionally passes from the hanging position into the exposure device or into the discharge region, which may coincide with the feed region. The route diverter can be disposed between the hanging region, the feed region, and/or the exposure unit.

In accordance with a further feature of the invention, an aligning device preferably ensures the alignment of the exposure surface, to be precise preferably in each respective region in the device, i.e., the hanging region, the feed region, the discharge region, and the table top. Thus, it is possible for the aligning device to have directing surfaces in the feed region and in the discharge region for aligning the exposure surface in the transverse direction. It is possible for the sliding blocks to be guided in grooves, for example, in the exposure region, in order to displace and align, and/or to position the exposure surface along its route.

In accordance with an added feature of the invention, the apparatus has at least one air-blower and/or suction device for predetermining sliding and/or attachment of the exposure surface in at least one region of the apparatus, i.e., the hanging region, the feed region, and the table top. With the device, it is possible, for example, in dependence on the air-stream strength and direction, for the exposure surface to slide on an air cushion as it is drawn up, to be guided with slight suction attachment during lowering, and to be fixed by relatively pronounced suction attachment after positioning in the exposure device.

Moreover, a punch for punching the exposure surface at the outlet of the exposure unit is preferably provided as a constituent part of the apparatus according to the invention. Thus, it is possible for the exposure surface to be provided with punch cutouts, by the punch, following the exposure. Such a configuration serves for positioning or mounting the exposure surface in a following piece of equipment. In accordance with an additional feature of the invention, the punch is disposed at the outlet of the exposure unit, that is to say, at a location that has to be passed by each exposure surface after the exposure, and is, thus, reached in each case regardless of the respective format of the exposure surface.

With the objects of the invention in view, in a printing plate exposer for handling and exposing a printing plate, the exposer having an exposure unit with an exposure region, there is also provided a handler including a printing plate hanging device for hanging the printing plate at least one of in a transitional state during introduction of the exposure surface into the exposure region and in a transitional state during discharge from the exposure unit.

The apparatus according to the invention is particularly advantageous as a constituent part of, or in direct conjunction with, a printing plate exposer because relatively is stiff and, nevertheless, sufficiently flexible printing plates made of any desired suitable material can be handled particularly well, precisely, economically, and continuously, with a high throughput and degree of automation by the apparatus according to the invention.

Other features that are considered as characteristic for the invention are set forth in the appended claims.

Although the invention is illustrated and d described herein as embodied in a method of, and apparatus for, handling an exposure surface that is to be exposed, in particular a printing plate, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWING

The FIGURE is a cross-sectional view of a apparatus for handling an exposure surface that is to be exposed according to the invention.

DESCRIPTION OF THE PREFERRED EMBODIMENTS

Referring now to the single FIGURE of the drawing, it is seen that an apparatus according to the invention is shown in a schematic cross-section along a route through the apparatus of an exposure surface that is to be exposed. A view of an edge of an exposure surface is indicated, by way of example, in various selected positions in the drawing and, thus, illustrates the movement sequence in the apparatus.

The apparatus according to the invention allows, to particularly good effect, the handling of preferably offset printing plates before, during, and after an exposure operation. In such a case, the printing plates or, more generally, the exposure surfaces that are to be exposed, may have a wide range of different formats, thicknesses, or coatings and, nevertheless, be positioned carefully, quickly and in register in an inner drum, on an outer drum, or on a flat exposure table of an exposure unit. It is possible here, in addition, for the apparatus according to the invention to have a compact construction, to produce a small "footprint", and to be cost-effective in nature and operation, in particular, by virtue of a relatively straightforward mechanism with a relatively small number of components and by virtue of straightforward and clear movement sequences. A high level of functional reliability is ensured at the same time.

The apparatus does not have any complicated or bulky structures on the exposure unit and can be loaded and reloaded manually and also fully automatically. There is no contact with the exposure surface in its printing region; rather, it is only retained in the region or surroundings of a possible punching action.

Important subassemblies and functional groups of an apparatus according to the invention will now be described hereinbelow, with reference to the exemplary embodiment, which is only illustrated schematically and by way of example in the drawing, as a constituent part of an innerdrum printing plate exposer.

The exposer illustrated has, as a feed region for printing plates 1a that are to be exposed, a plate table 2 that, for ergonomic reasons, is inclined through approximately 10 degrees into the exposer. As a result of the inclination, however, a printing plate 1a that is introduced also advantageously slips automatically, due to gravity, into a desired feed position, as far as a stop 3. With the aid of a fan 4, on the surface of the plate table 2, an air cushion is produced beneath the printing plate 1a, with the result that the plate 1a slides with friction-reducing action in the feed region.

The printing plate 1a is centered on the plate table 2 by two non-illustrated centering slides that can be driven in opposite directions. The slide device automatically returns into its zero position, which is interrogated by a non-illustrated sensor. The presence of a printing plate 1a on the plate table is determined, in addition, by a non-illustrated plate-presence sensor.

The structural unit with the plate table 2 has a self-supporting configuration and, if desired, may be removed completely if, for example, the exposer is to be upgraded to a fully automatic machine with automatic plate reloading from a magazine.

The apparatus according to the invention includes an upwardly projecting boom 6 on which is suspended a gripping device 7 (separate positions indicated with references 7a, 7b, and 7c) that is intended for gripping the printing plate 1a and, in the drawing, is indicated (with dotted lines) in a bottom position at 7a and in a top position at 7b. In accordance with these positions, the gripping device 7 draws the printing plate 1a upward through an intermediate position 1b into a hanging position 1c. Different positions of the printing plate in the apparatus are included in the drawing to illustrate the movement sequence thereof and are each designated 1 with the addition of different lower-case letters, in other words, 1a to 1e.

The boom 6 with its gripping device 7 has the task of conveying the printing plate 1 from the plate table 2, through the hanging position 1c, into an exposure unit 8 and back again, on the same route, onto the plate table 2 that, in the illustrated exemplary embodiment of an apparatus according to the invention, also serves as the removal or discharge region for the printing plate 1 once exposed. The route of the printing plate 1 through the apparatus is indicated, corresponding to the two through-passage directions of the route by double arrows 9. The movement sequence is assisted and controlled by a printing-plate guide 11, 11' that is constructed as a route diverter and can be pivoted in the direction of the double arrow 10.

The boom 6 is configured such that it can also be used, without being changed in any way, in a fully automatic apparatus. It is supported in the region of the printing-plate guide 11.

The gripping device 7 is constructed as a gripper bar that runs on a carriage on a recirculating-ball guide, which is driven by a stepping motor with gear mechanism through a toothed belt, all of which is illustrated diagrammatically. The gripper bar has a pivoting articulation 12 about which the gripper bar can be pivoted in the direction of a double arrow 12a in order, on one hand, to feed the printing plate 1 vertically to the exposure unit 8 and, on the other hand, to retrieve the printing plate 1 from the plate table 2, or deposit it thereon again, more or less horizontally. The operations of pivoting the gripper bar upward and opening the same are carried out by a non-illustrated motor and are interrogated by non-illustrated sensors. In a currentless or de-energized state, a spring 13 pushes the gripper bar closed. The gripper bar has non-illustrated aligning stops for the printing plate 1. In addition, the presence of the printing plate 1 in the gripper bar is monitored through a non-illustrated sensor.

The plate guide 11 has the task of guiding the printing plate 1 reliably into the exposure unit 8, and it has to direct the imaged printing plate 1 for depositing the plate 1 on the plate table 2. The region of the plate guide 11 bears the boom 6 and is fastened on the exposure unit 8. A centrally slit, angled, honeycomb plate forms the framework of the plate guide 11. Because the printing plate 1 is only gripped by the gripper bar at the top end, negative-pressure-generating fans 14 in the honeycomb plate ensure that the printing plate is introduced into the exposure unit 8 along the boom 6 and in abutment against the boom 6. The fans 14 are configured such that the printing plate 1 cannot buckle or bend out, but a pushing action of the printing plate is still possible and reliably ensured. An unloading device is fitted on the plate guide 11 for the purpose of depositing the printing plate 1 on the plate table 2. Driven by motor and monitored by two sensors, two arms or a segment of the honeycomb plate pivot, beneath the printing plate 1, in the direction of the double arrow 10 and, thus, direct the bottom end of the printing plate 1 onto the plate table 2. Also located on the plate guide 11 are non-illustrated two sensors that sense the bottom end of the printing plate 1 and are used for a plausibility check.

The exemplary embodiment depicted shows the exposure unit 8 of an inner-drum printing plate exposer by way of example.

The printing plate 1e is positioned, fixed and imaged in the exposure unit 8. The exposure unit 8 substantially includes an exposure head 15 with an optical exposure device, a trough 16 or inner-drum shell as a bed for the printing plate 1e that is to be exposed in the exposure unit, the exposure head 15 being disposed along the axis line thereof, a non-illustrated plate slide for positioning the printing plate 1e in the is trough 16, and the slide fingers of which project upward in the trough 15, and a through-punch 17 for punching the printing plate 1e after the exposure, as the printing plate 1e passes out of the trough 16.

The trough 16 has a special non-stick coating over which the printing plate 1e can slide on its rear side. Vacuum grooves that run on parallel circumferential lines of the trough 16, on the inside of the trough 16, are disposed such that the largest possible number of different plate formats can be attached by suction. The vacuum or the attachment by suction by a pumping device 18 (only diagrammatically illustrated) serves for fixing the printing plate 1e during the exposure and the punching.

The punch 17 is fixed to the trough 16, and adjusted in relation to the trough 16, on the plate-inlet side of the trough 16. For the slide fingers or sliding blocks of the plate slide and for toothed drive belts of the plate slide, the trough has two non-illustrated guide grooves in the circumferential direction. The slide fingers are driven by motors through toothed belts and pushed against the border of the printing plate 1e. They have the task, on one hand, for pressing the printing plate 1e against the trough surface for suction attachment and, on the other hand, to assist the gripping device 7, hanging on the boom 6, to push the printing plate 1e against the extended punching ram of the punch 17. The punching rams may be used, for the exposure, as positioning stops for the printing plate 1e, and it is then possible for the printing plate, still attached by suction, to be punched in the same position immediately after the exposure. Alternatively, however, it is also possible for suitable stops of the gripping device 7 to be used for positioning the printing plate 1e.

The handling of the printing plate 1 in the illustrated exemplary embodiment of an inner-drum printing plate exposer proceeds according to the following text.

First, the piece of equipment is switched on. To initialize the piece of equipment or to check its readiness for operation, it is possible to test or run through, and monitor by sensors, different functions of the equipment. If the equipment is ready for operation, then this may be indicated, for example, by an audible or visual indicator, such as a lamp.

The user then positions a new printing plate 1 on the plate table 2 to load the piece of equipment anew. Alternatively, it would also be possible, in the case of automatic reloading, for a new printing plate to be drawn out of a magazine. A non-illustrated sensor in the plate table 2 senses the presence of a new printing plate and a plate sensor in the gripper switches on the fan 4, with the result that the printing plate can then float on an air cushion. Thereafter, it is possible for the centering slides to center the printing plate, in a sensor-monitored manner, and also determine the plate width, thereupon the centering slides release the printing plate again.

Thereafter, the rest of the procedure may be automated or the user pushes a starting button 19 to continue the procedure.

The gripping device 7a senses and grips the printing plate 1a.

The vertical motor, by which the gripping device 7a is drawn upward into the position 7b, in the process carrying along and raising the printing plate 1a into the position 1c, is switched on. In parallel with such an operation, the top fan 14 is also switched on. The motor by which the gripper articulation 12 is pivoted is started, with the result that it pivots under its own weight into vertical alignment. The fan 4 of the plate table 2 is switched off. The vertical motor accelerates to approximately 400 mm/s. In such a case, by counting encoder cycles, the vertical motor travels a certain distance, depending on the respective printing-plate length, until the printing plate hangs, in the position 1c, with its full length in a vertical orientation. The top fan 14 attaches the printing-plate end by suction here non-illustrated sensors are used to attempt to achieve a resolution of 0.1 mm for a positional accuracy of ±1 mm. It is possible to provide, for example, a sensor for sensing the printing-plate length or the printing-plate end and a sensor for sensing the abutment of the printing plate 1 against the plate guide.

The route diverter is in the position 11 and the bottom fan 14 is switched on. By the vertical motor, the printing plate is then lowered and displaced through the position 1d into the position 1e in the trough 16.

The vertical motor of the gripping device pushes the printing plate first of all approximately 15 mm beyond its exposure position in the trough, with the result that the punching ram of the punch 17 can extend behind the printing plate, with obstruction by the relatively narrow gripping device. Thereafter, the punching ram is used as a stop for the printing plate and for supporting the gripping device, in that the gripping device draws the printing plate the approximately 15 mm upward again against the punching ram. The slide fingers also execute a pushing action with the motor switched on. It is only then that the printing plate is fixed in its now located exposure position 1e, in that a vacuum is generated in the trough, beneath the printing plate, by the pump device 18. The exposure is then carried out.

After the exposure, the punching ram of the punch 17 is retracted to the full extent and the punching of the exposed printing plate is, thus, carried out (through-punch). Moreover, the action frees the route for the printing plate to pass out of the trough 16.

The pump device 18 is switched off, with the result that there is no vacuum in the trough 16 and the printing plate is freed for movement. For such a purpose, the bottom and the top fans 14 are switched on to guide the printing plate. By the vertical motor and the gripping device 7 driven thereby, the plate is then drawn into its top position 1c again. The bottom end of the printing plate 1c is, in turn, interrogated by a sensor. The bottom fan 14 is then switched off.

The corresponding sensors are then used to interrogate whether or not the plate table 2 is free and the centering slides have moved apart from one another. The route diverter is moved into its position 11'. The vertical motor then lowers the gripping device 7b, and the printing plate 1c hanging thereon, again and directs the plate 1, in accordance with the diverter position, onto the plate table 2, through the position 1b, into the position 1a. During the deflection into the horizontal, the articulation 12 of the gripping device 7 is angled by a non-illustrated pivoting motor. The route diverter has already been pivoted back out of the position 11' into the position 11, as soon as the bottom border of the printing plate reached the plate table 2 in the position 1b and it was ensured that the printing plate would be directed onto the plate table 2, to release the way for the gripper bar to be lowered further.

As soon as the printing plate 1a is located on the plate table, the condition is sensed by sensor and the gripping device 7a opens. The presence of the printing plate 1a is indicated, with the result that the user removes the finished printing plate 1a. Alternatively, it is also possible for the removal to take place automatically.

It is noted that a considerable advantage of the apparatus according to the invention is that, rather than being released, the printing plate is retained in a controlled manner throughout the entire process, namely during transportation, fixing, exposure, punching, and removal.

We claim:

1. In an apparatus for handling and exposing a printing plate having a border, the apparatus having an exposure unit with an exposure region, a handler comprising:
    a plate table; and
    a printing plate hanging device for conveying the printing plate from the plate table through a hanging position into the exposure unit and back again, on the same route, onto the plate table, said hanging device:
       being disposed vertically above said plate table;
       having a substantially vertically extending boom; and
       being a lifting and lowering device with at least one gripper selectively gripping the border of the printing plate.

2. The apparatus according to claim 1, wherein said at least one gripper encloses the border.

3. The apparatus according to claim 1, wherein said hanging device has a printing plate hanging region and a feed region connected to said hanging region in an exposure surface movement direction.

4. The apparatus according to claim 3, wherein said feed region is an approximately horizontally aligned table top.

5. The apparatus according to claim 4, including at least one aligner for aligning the printing plate, said aligner disposed in at least one of the group consisting of said hanging region, said feed region, and said table top.

6. The apparatus according to claim 4, including at least one air-blower guiding the printing plate in at least one of the group consisting of said hanging region, said feed region, and said table top.

7. The apparatus according to claim 3, wherein said feed region is a table top oriented approximately ten degrees from horizontal.

8. The apparatus according to claim 3, wherein said feed region is an exchangeable magazine holding at least one printing plate.

9. The apparatus according to claim 3, including a route diverter for diverting the printing plate, said route diverter disposed between at least two of the group consisting of said hanging region, said feed region, and the exposure unit.

10. The apparatus according to claim 3, including a route diverter for diverting the printing plate, said route diverter disposed between said hanging region, said feed region, and the exposure unit.

11. The apparatus according to claim 1, wherein:
    the apparatus has an exposure unit introduction region; and
    said hanging device is disposed vertically above the exposure unit introduction region.

12. The apparatus according to claim 1, including an aligner for aligning the printing plate.

13. The apparatus according to claim 1, including at least one air-blower guiding the printing plate in a predetermined manner.

14. The apparatus according to claim 13, wherein said air blower is a suction device.

15. The apparatus according to claim 1, wherein:
    the exposure unit has an outlet; and
    a punch is disposed at the outlet of the exposure unit and punches the printing plate in a region of the exposure unit outlet.

16. The apparatus according to claim 1, wherein the exposure unit is a printing plate exposer.

17. The apparatus according to claim 1, wherein the exposure unit is an inner-drum printing plate exposer.

18. The handler according to claim 1, wherein:
    said hanging device has a feed region and a loading region and transfers the printing plate from an approximately horizontal orientation in one of said feed region and said loading region into a hanging orientation; and
    said hanging device lowers the printing plate for introduction into the exposure unit.

19. The handler according to claim 18, wherein said hanging device has at least one gripper gripping the printing plate at a border thereof in said feed region and drawing the printing plate upward into the hanging orientation.

20. The handler according to claim 18, further comprising at least one air-blower feeding air beneath the printing plate to reduce friction in said feed region.

21. The handler according to claim 18, wherein:
    said hanging device has a discharge region being the same region as said feed region; and
    said hanging device discharges the printing plate from the exposure unit to said discharge region.

22. The handler according to claim 21, wherein:
    said hanging device has an exposure region; and
    a route diverter selectively directs the printing plate from the hanging orientation into one of group consisting of said feed region, said discharge region, and said exposure region on a course from said feed region, through the hanging orientation, into said exposure region, and back.

23. The handler according to claim 18, wherein:

said hanging device has a discharge region and an exposure region; and said hanging device discharges the printing plate from the exposure unit to said discharge region and aligns the printing plate in one of the group consisting of said feed region, said discharge region, and said exposure region.

24. The handler according to claim 1, wherein:

said hanging device has a feed region and a loading region and transfers the printing plate from approximately ten degrees from horizontal in one of said feed region and said loading region into a hanging orientation; and said hanging device lowers the printing plate for introduction into the exposure unit.

25. The handler according to claim 1, wherein said hanging device hangs the printing plate in the transitional state before and after an exposure of the printing plate.

26. The handler according to claim 1, wherein said hanging device, after an exposure of the exposure surface, transfers the exposure surface into the hanging orientation and thereafter moves the exposure surface into an approximately horizontal discharge position.

27. The handler according to claim 1, further comprising an air suction device enhancing placement of the printing plate in the hanging orientation with suction air.

28. The handler according to claim 1, further comprising a punch for punching the printing plate after exposure of the printing plate.

29. The handler according to claim 28, wherein said handing device feeds the printing plate to said punch and guides the printing plate past said punch in a removal direction from the exposure unit.

30. A handler for handling a printing plate with respect to a plate table and an exposure unit, the handler, comprising:

a printing plate hanging device conveying the printing plate from the plate table through a hanging position into the exposure unit and back again, on the same route, onto the plate table, said hanging device:

being a lifting and lowering device with at least one gripper selectively gripping the border of the printing plate;

having a substantially vertically extending boom; and adapted to be disposed vertically above said plate table.

* * * * *